United States Patent
Hayakawa

(10) Patent No.: US 11,876,192 B2
(45) Date of Patent: Jan. 16, 2024

(54) ASSEMBLED BATTERY MONITORING APPARATUS

(71) Applicant: DENSO CORPORATION, Kariya (JP)

(72) Inventor: Takahito Hayakawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 633 days.

(21) Appl. No.: 17/117,765

(22) Filed: Dec. 10, 2020

(65) Prior Publication Data

US 2021/0098835 A1 Apr. 1, 2021

Related U.S. Application Data

(63) Continuation of application No. PCT/JP2019/013672, filed on Mar. 28, 2018.

(30) Foreign Application Priority Data

Jun. 12, 2018 (JP) ................. 2018-111891

(51) Int. Cl.
   *H01M 10/48* (2006.01)
   *H01M 10/42* (2006.01)
   *G01R 31/396* (2019.01)
   *G01R 31/3842* (2019.01)

(52) U.S. Cl.
   CPC ........ *H01M 10/482* (2013.01); *G01R 31/396* (2019.01); *H01M 10/425* (2013.01); *H01M 10/48* (2013.01); *H01M 10/486* (2013.01); *G01R 31/3842* (2019.01); *H01M 2010/4271* (2013.01)

(58) Field of Classification Search
   None
   See application file for complete search history.

(56) References Cited

U.S. PATENT DOCUMENTS

2015/0024242 A1   1/2015  Nishiwaki
2017/0168130 A1*  6/2017  Hase ........................ H02J 7/005

FOREIGN PATENT DOCUMENTS

JP           6160557 B2    12/2015

* cited by examiner

*Primary Examiner* — Zhongqing Wei
(74) *Attorney, Agent, or Firm* — POSZ LAW GROUP, PLC

(57) ABSTRACT

An assembled battery monitoring apparatus includes a plurality of monitoring circuits and a control circuit that transmits a command to the plurality of monitoring circuits at each of cycles. In response to receiving a communication interruption command including a value data, one of the plurality of monitoring circuits is configured to apply a calculation process on the value data included in the received communication interruption command to obtain an updated value data, and transmit a communication interruption command including the updated value data to a downstream side in the daisy chain connection up to the control circuit. In response to thereafter receiving a communication interruption command including a value data, the control circuit is configured to identify a location where a communication interruption occurs based on the received value data included in the received communication interruption command.

2 Claims, 10 Drawing Sheets

| 15 0 | 15 0 | 15 4 3 0 | 15 0 |
|---|---|---|---|
| ITF COMMAND | COMMAND CRC | 0x000 COUNT VALUE | COUNT CRC |

ASSEMBLED BATTERY MONITORING APPARATUS

CROSS REFERENCE TO RELATED APPLICATIONS

The present application is a continuation application of International Patent Application No. PCT/JP2019/013672 filed on Mar. 28, 2019, which designated the U.S. and claims the benefit of priority from Japanese Patent Application No. 2018-111891 filed on Jun. 12, 2018. The entire disclosures of all of the above applications are incorporated herein by reference.

TECHNICAL FIELD

The present disclosure relates to an apparatus for monitoring an assembled battery configured by connecting a plurality of battery cells in multiple stages in series.

BACKGROUND

There is an apparatus for monitoring an assembled battery; the apparatus has a configuration which connects a plurality of ICs connected to an assembled battery to detect a voltage with an ECU transmitting a command to the ICs in a daisy chain connection to perform communication. The daisy chain connection has a forward path and a backward path in communications. Such an apparatus detects whether the disconnection occurs in the forward path or the backward path.

SUMMARY

According to an example of the present disclosure, an assembled battery monitoring apparatus is provided to monitor an assembled battery configured by connecting a plurality of battery cells in multiple stages in series. The assembled battery monitoring apparatus includes (i) a plurality of monitoring circuits connected to the assembled battery and (ii) a control circuit connected with the plurality of monitoring circuits in a daisy chain connection to perform communication. The plurality of monitoring circuits are configured to monitor a state of the assembled battery. The control circuit is configured to transmit a command to the plurality of monitoring circuits at each of cycles to provide an instruction.

In response to receiving a communication interruption command including a value data, one of the plurality of monitoring circuits is configured to (i) apply a calculation process on the value data included in the received communication interruption command to obtain an updated value data, and (ii) transmit a communication interruption command including the updated value data to a downstream side in the daisy chain connection up to the control circuit. In response to thereafter receiving a communication interruption command including a value data, the control circuit is configured to identify a location where a communication interruption occurs based on the received value data included in the received communication interruption command.

BRIEF DESCRIPTION OF DRAWINGS

The objects, features, and advantages of the present disclosure will become more apparent from the following detailed description made with reference to the accompanying drawings. In the drawings.

DETAILED DESCRIPTION

First Embodiment

Figure 6:
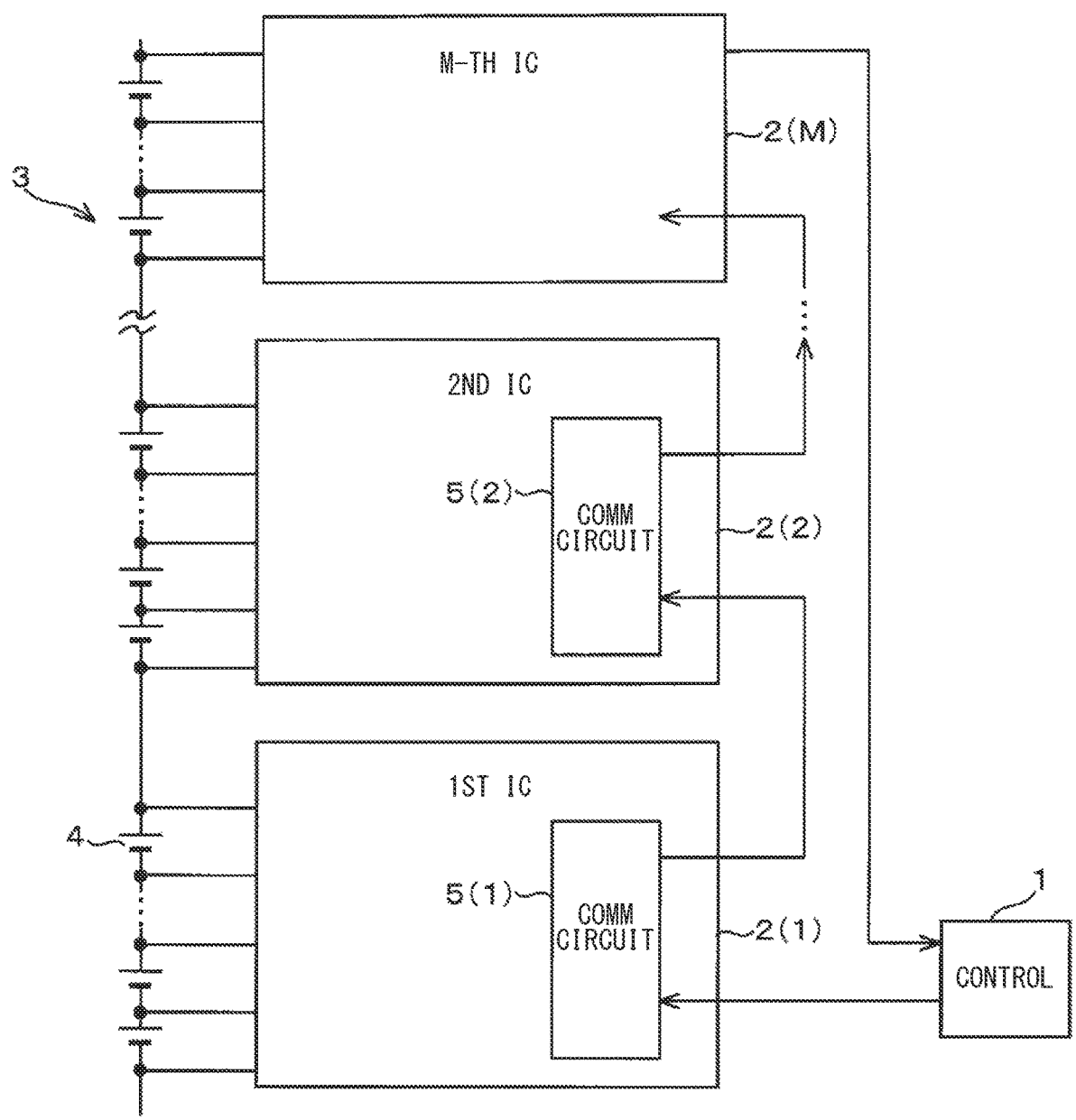
FIG. 6 is a diagram showing a configuration of an assembled battery monitoring apparatus.

As shown in FIG. 6, the assembled battery monitoring apparatus according to a first embodiment includes a control IC 1 and M monitoring ICs 2(1) to 2(M), for instance. The assembled battery 3 is configured by connecting a plurality of battery cells 4 in series, and each of the monitoring ICs 2(1) to 2(M) measures the state (e.g., voltage, current temperature) of a predetermined number of battery cells 4. Each of the control IC 1 and the monitoring IC 2 includes a microcomputer or the like. The control IC 1 and the monitoring ICs 2(1) to 2(M) are connected in a daisy chain form or connection. The control IC 1 corresponds to a control circuit, and the monitoring IC 2 corresponds to a monitoring circuit.

In the following description, the control IC 1 side may be referred to as "upstream side" and the monitoring IC 2 side may be referred to as "downstream side" in the description of the direction in which commands are transferred. When the control IC 1 transmits a command to the monitoring IC 2(1), the command is sequentially transferred in the order of monitoring IC 2(1)→monitoring IC 2(2) monitoring IC 2(M)→control IC 1. In response to the received command, the monitoring IC 2 attaches data indicating the state of the battery cell 4 to be measured to the command, and transmits the command to the control IC 1 by transferring the command to the downstream side.

Figure 1:
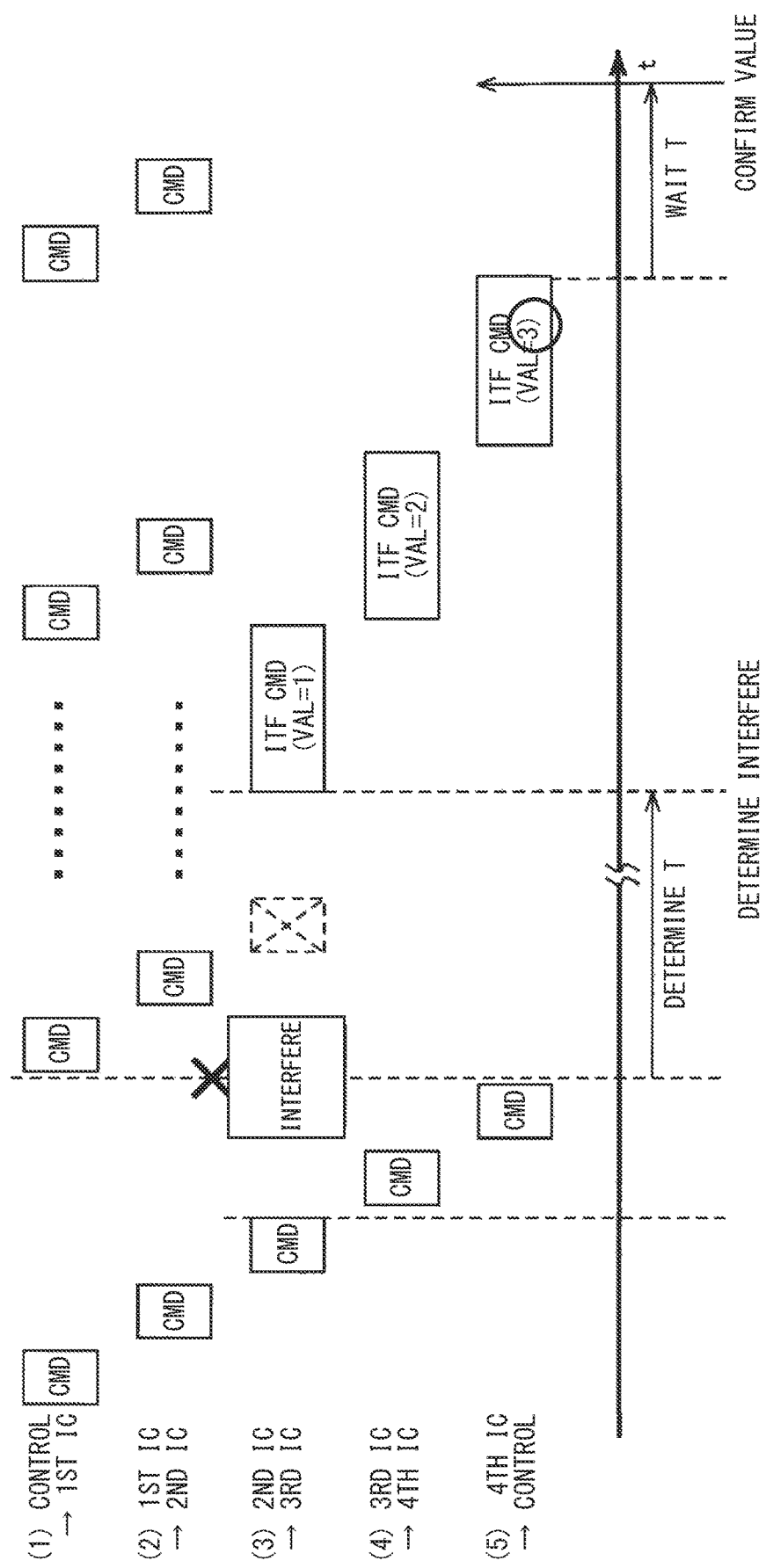
FIG. 1 is a timing chart showing a state in which a communication interruption command is transferred between a control IC and a monitoring IC when a communication interruption occurs, in a first embodiment.

In this embodiment, as shown in FIG. 1, the control IC 1 transmits a command to the monitoring IC 2 at a constant cycle. The monitoring IC 2 measures the cycle time for receiving the command. When the cycle time exceeds the interruption determination time, the monitoring IC 2 transfers a communication interruption command to the downstream side of itself.

Figure 5:
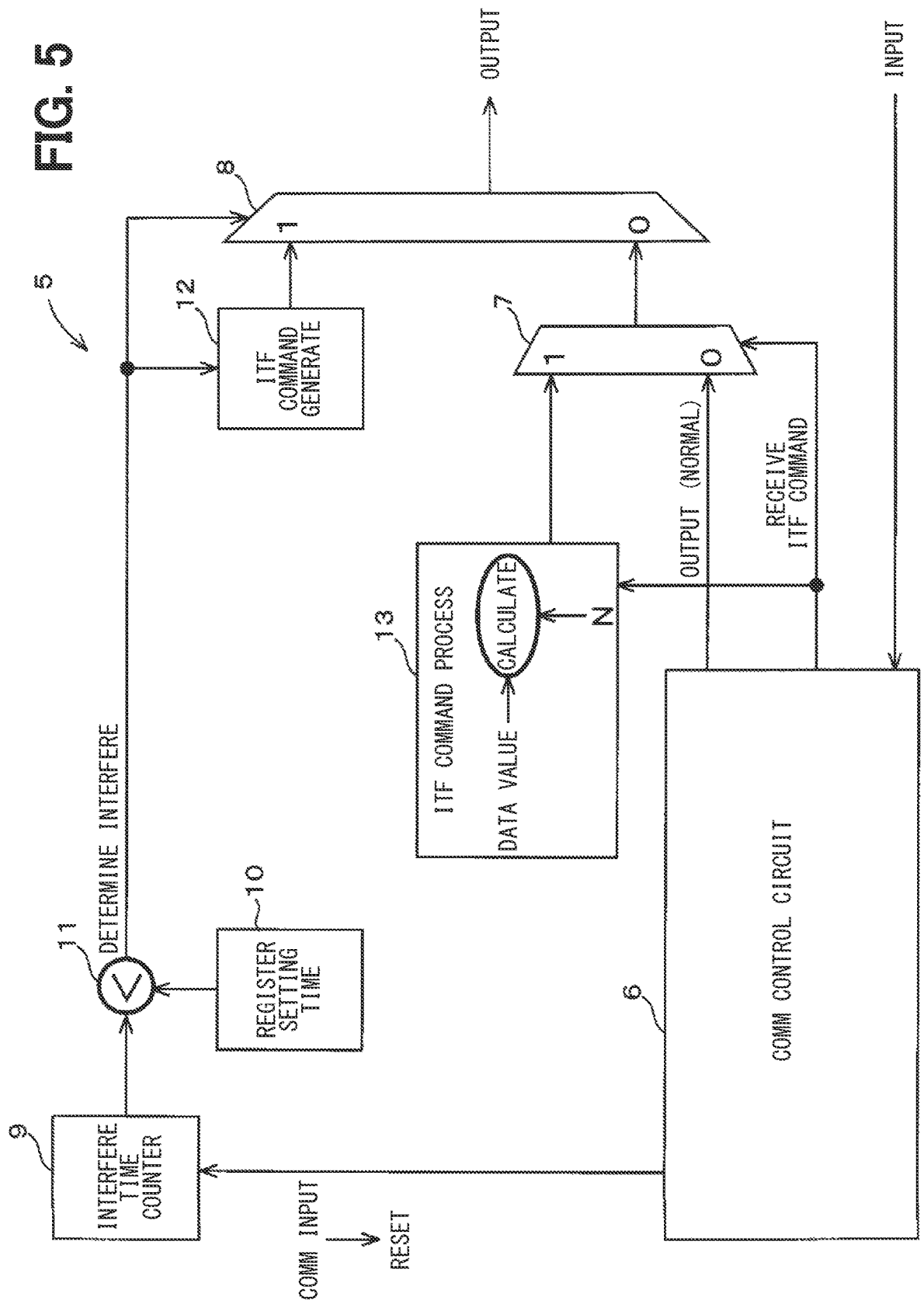
FIG. 5 is a functional block diagram showing a configuration of a communication circuit included in the monitoring IC.

The monitoring IC 2 includes a corresponding communication circuit 5. As shown in FIG. 5, the communication circuit 5 includes a communication control circuit 6. When the command transmitted from the upstream side is input, the communication control circuit 6 writes the state data of the battery cell 4 and the like in the command and outputs the command to the downstream side. The output is performed via the two selectors 7 and 8. An interruption time counter 9 is a counter that measures a command reception cycle. The communication control circuit 6 outputs a reset signal to the interruption time counter 9 each time a command is received.

Time data for determining the occurrence of a communication interruption is set in the interruption determination time setting register 10. The comparator 11 compares the set value (i.e., set time data) in the register 10 with the count value (i.e., value data) of the interruption time counter 9. Then, when the count value exceeds the set value in the register 10, the interruption determination signal is set to an active level, for example, high.

The interruption determination signal is input to the interruption command generation unit 12 and the selector 8. The interruption command generation unit 12 outputs a communication interruption command when the interruption determination signal becomes active. The count value to be calculated by each monitoring IC 2 is written in the communication interruption command. The interruption command generation unit 12 sets the count value to an initial value (i.e., an initial value data), for example, "1". The selector 8 selects the selector 7 side when the interruption determination signal is inactive, and selects the interruption command generation unit 12 side when the interruption determination signal is active.

When the command transmitted by the control IC 1 is input, the communication control circuit 6 transmits a response to the command to the downstream side via the selectors 7 and 8. On the other hand, when the communication interruption command is input, the communication control circuit 6 transfers the communication interruption command to the interruption command processing unit 13 and switches the selector 7 to the interruption command processing unit 13 side. The interruption command processing unit 13 performs a process of adding N=1, for example, as a predetermined calculation to the count value written in the transferred command. Then, the communication interruption command in which the updated count value (i.e., undated value data) is written is output to the selector 7.

Figure 4:
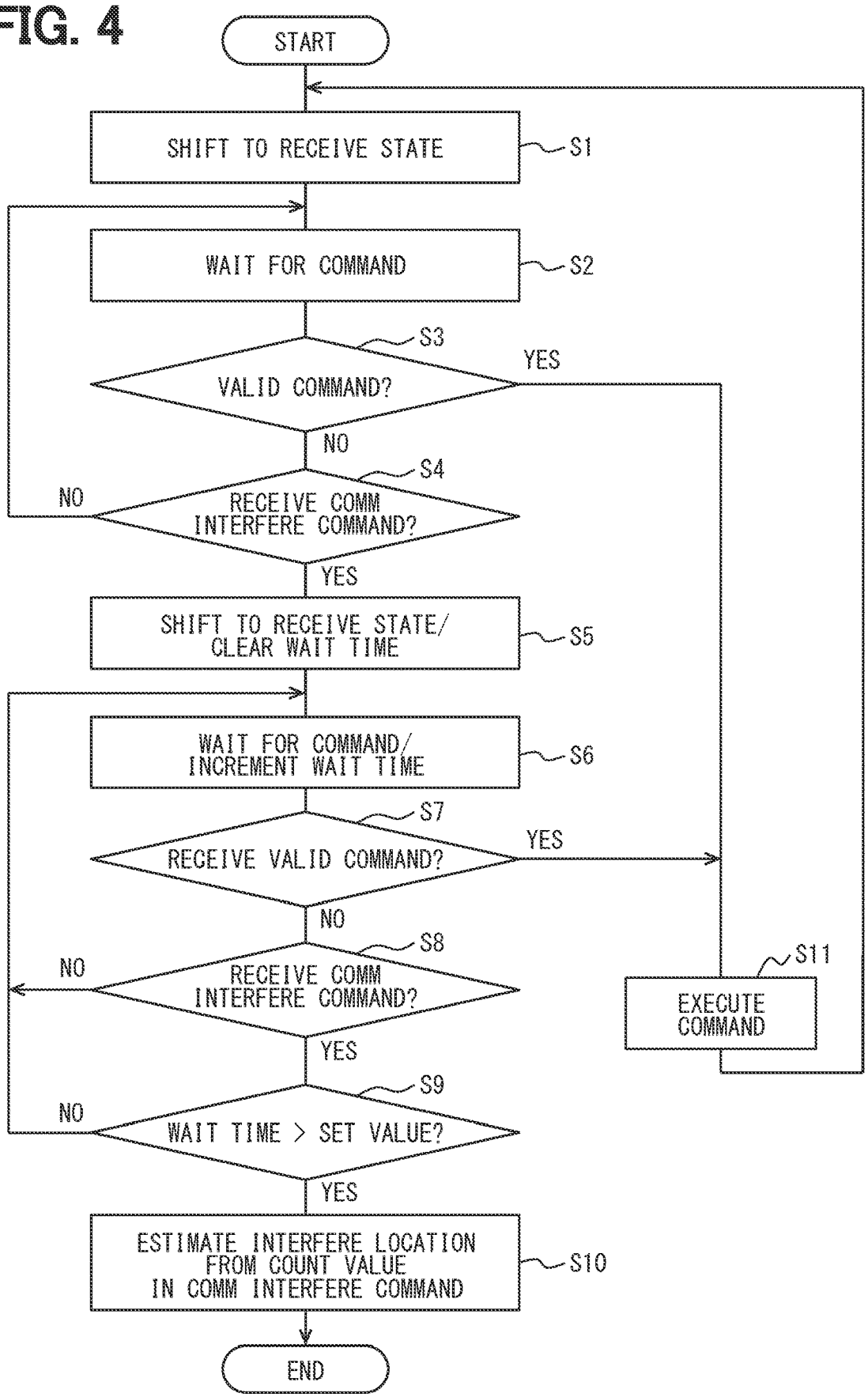
FIG. 4 is a flowchart showing a reception process of the control IC.

Next, operation of the present embodiment will be described. As shown in FIG. 1, the control IC 1 transmits a command to the monitoring IC 2 in a constant cycle, for example, a cycle of several tens µs to several ms. Further, as shown in FIG. 4, suppose that the control IC 1 receives a command from the monitoring IC 2, as processing on the receiving side (S2→S3). In this case, if such a command is a valid command other than a communication interruption command (S3: YES), the control IC 1 executes the command (S11) and then shifts to a normal reception state again (S1).

On the other hand, when the communication interruption command is received from the monitoring IC 2 (S3: NO→S4: YES), the control IC 1 shifts to the communication interruption receiving state and clears the determination waiting time counter (S5). Then, the control IC 1 waits for the reception of the next command and counts up the determination waiting time counter (S6). Next, the same determinations as in steps S3 and S4 are performed (S7, S8). If the command is a valid command other than the communication interruption command (S7: YES), the process proceeds to step S11.

Here, when the control IC 1 receives the communication interruption command (S8: YES), it is determined whether or not the value of the determination waiting time counter exceeds the set value (S9). If it does not exceed the set value (NO), the process returns to step S6. If it exceeds the set value (YES), the location where the communication interruption occurs is estimated from the count value in the communication interruption command received at that time (S10).

Figure 2:
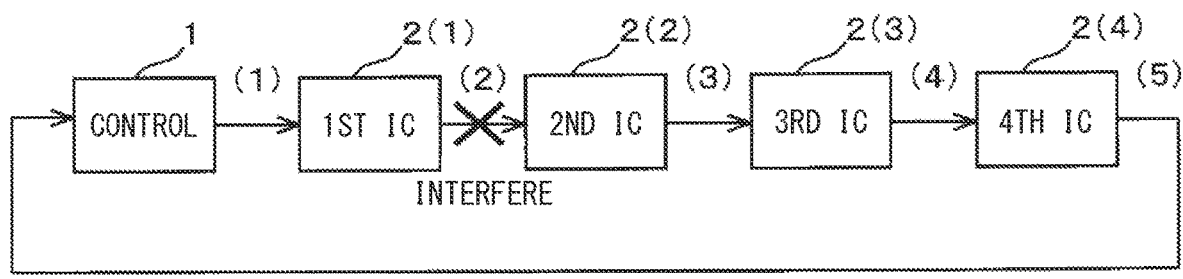
FIG. 2 is a diagram showing a location where a communication interruption occurs.

As shown in FIG. 1, if the communication line connecting between the control IC 1 and the monitoring ICs 2 is normal, the command transmitted by the control IC 1 is received by the control IC 1 after passing through each monitoring IC 2. Here, as shown in FIG. 2, it is assumed that a communication interruption occurs between the monitoring IC 2(1) and the monitoring IC 2(2). Note that FIG. 2 shows the case of M=4. In this case, the command transmitted by the monitoring IC 2(1) is no longer received by the monitoring IC 2(2).

Then, in the communication circuit 5 of the monitoring IC 2(2), the interruption time counter 9 is not reset and the count value continues to increase. Then, when the count value exceeds the set value in the register 10 (e.g., the interruption determination value of about 10 ms), the communication circuit 5 of the monitoring IC 2(2) transmits the communication interruption command. The count value included in the command is "1". Upon receiving the command, the communication circuit 5 of the monitoring IC 2(3) increments the count value to "2", and transmits the command to the monitoring IC 2(4) on the downstream side. The communication circuit 5 of the monitoring IC 2 (4) increments the count value to "3", and transmits the communication interruption command to the control IC 1.

When first receiving the communication interruption command (S4; YES), the control IC 1 clears the determination waiting time counter (S5) and starts counting up (S6). Since the communication interruption state continues, the monitoring IC 2(2) repeatedly transmits the communication interruption command having the count value of "1". As a result, the control IC 1 also repeatedly receives the communication interruption command whose count value is "3". Therefore, the control IC 1 confirms the count value "3" of the communication interruption command being received when the value of the determination waiting time counter exceeds the set value from the first reception. Thus, it is estimated that the communication interruption has occurred between the monitoring IC 2(1) and the monitoring IC 2(2).

Figure 3:
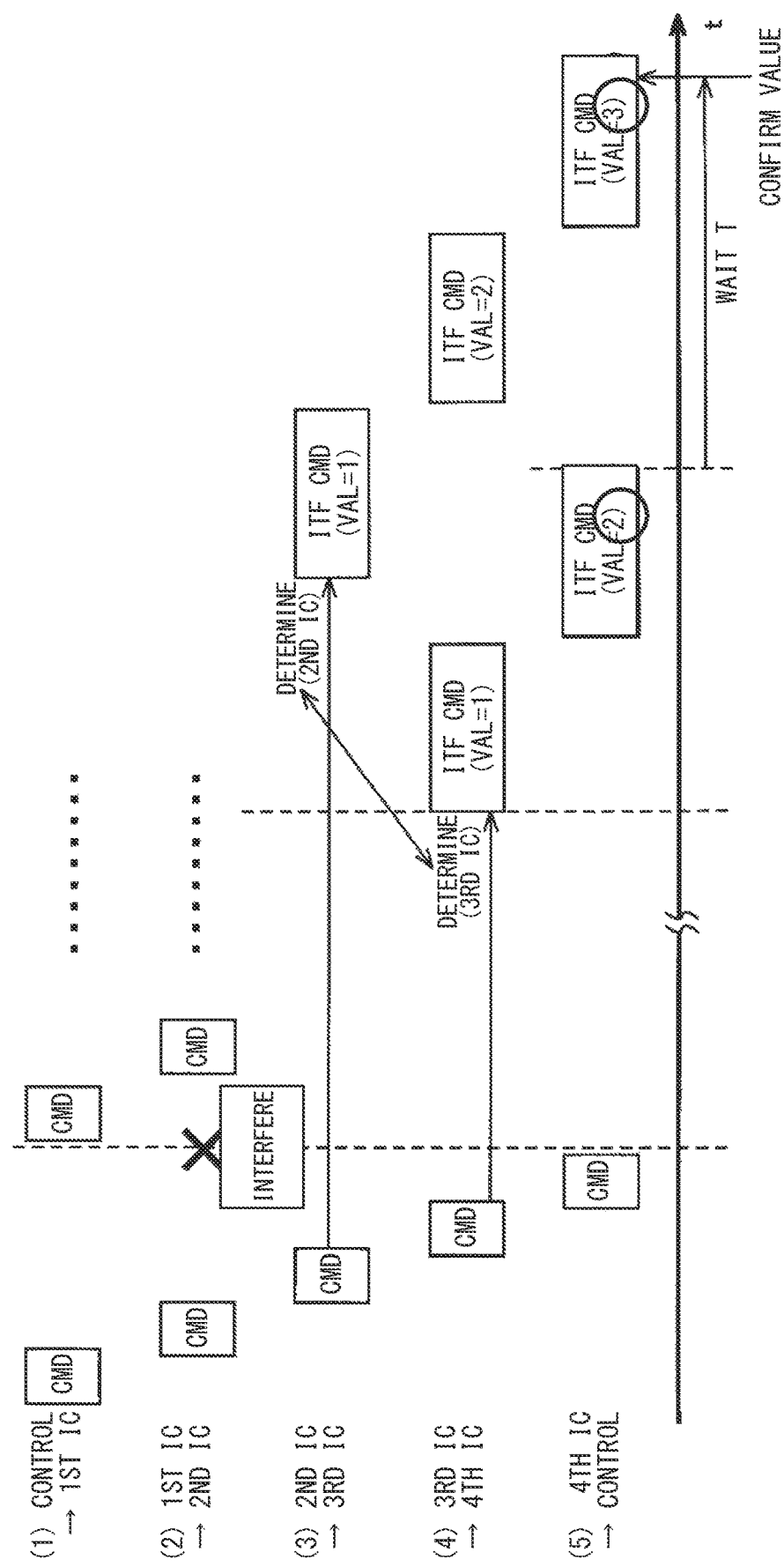
FIG. 3 is a timing chart assuming a case where the control IC makes an erroneous determination when a communication interruption occurs.

Here, as shown in FIG. 3, for example, due to an error between the monitoring ICs 2, the monitoring IC 2(3) determines the communication interruption before the monitoring IC 2(2). Then, the control IC 1 first receives the communication interruption command having the count value "2". If the control IC 1 identifies the location of the communication interruption at this reception timing, it will result in an erroneous determination. On the other hand, erroneous determination is prevented by specifying the occurrence location when a sufficient determination waiting time has elapsed from the time when the first communication interruption command was received.

As described above, according to this embodiment, the followings operate. A plurality of monitoring ICs 2 monitor the state of the assembled battery 3. A control IC 1 transmits commands with cycles to the monitoring ICs 2 to provide instructions. The plurality of monitoring ICs 2 and the control IC 1 are connected by a daisy chain connection or form to perform communication. When the monitoring IC 2 determines that the command transmitted by the control IC 1 has not been received over the set cycle, the monitoring IC 2 transmits a communication interruption command that contains an initial value data (i.e., an initial count value data) to the downstream side of itself.

Upon receiving the communication interruption command, the monitoring IC 2 performs a calculation process on a count value (i.e., a count value data, a value data) contained in the command to provide an updated value (i.e., an updated count value, an updated count value data, an updated value data) as a calculation result, and transmits the communication interruption command containing the updated value to the downstream side. In response to receiving the communication interruption command, the control IC 1 identifies a location where the communication interruption occurs based on a value data included in the received communication interruption command. As a result, the control IC 1 can identify the location or the monitoring IC 2 located at the location at which the communication interruption has occurred, based on the received communication interruption command.

Second Embodiment

Figure 7:
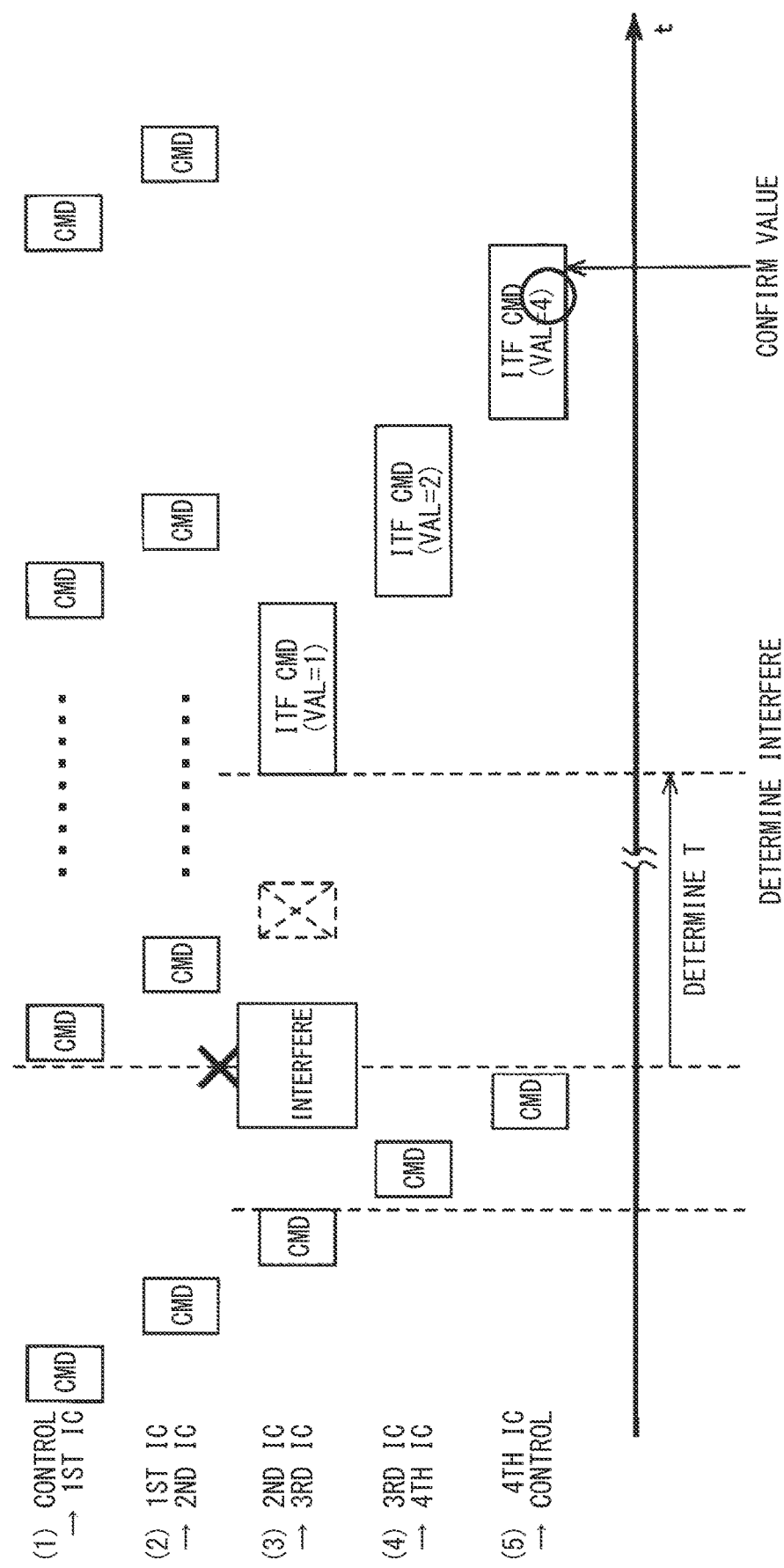
FIG. 7 is a timing chart showing a state in which a communication interruption command is transferred between a control IC and a monitoring IC when a communication interruption occurs, in a second embodiment.

Hereinafter, the same parts as those in the first embodiment are designated by the same reference sings, and the description thereof will be omitted. Only different parts will be described. As shown in FIG. 7, in the communication circuit 5 of the monitoring IC 2 in a second embodiment, the calculation performed by the interruption command processing unit 13 on the count value of the communication interruption command is different. In the second embodiment, the count value is multiplied by "N=2". From this, when the communication interruption occurs as in the first embodiment, the count value included in the communication interruption command received by the control IC 1 is "4". According to the second embodiment as described above, the same effects as those of the first embodiment can be obtained.

Third Embodiment

Figures 10, 11:
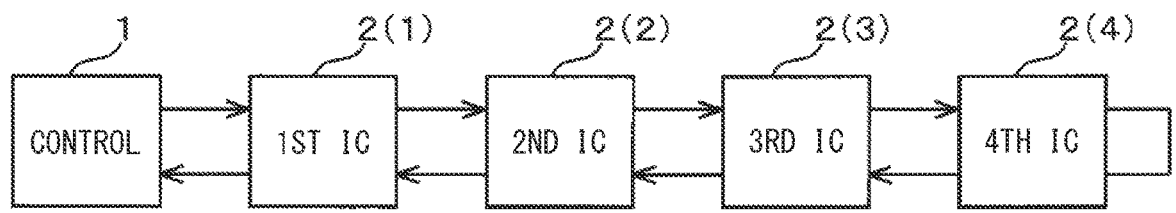
FIG. 10 is a diagram showing a communication frame of a communication interruption command.
FIG. 11 is a diagram showing a modification of a daisy chain connection, in a fourth embodiment.

In a third embodiment, the command or command frame used for communication includes a check code such as CRC (Cyclic Redundancy Cord). FIG. 10 shows an example of a communication frame including a command (e.g., a communication interruption command), a CRC of the command, a count value (i.e., a count value data, a value data), and a CRC of the count value. Each of the command, the CRC of the command, the count value, and the CRC of the count value is configured to be 16 bits; the communication frame is thus configured to be 64 bits as a whole. The count value is assumed that the maximum number of monitoring ICs 2 is "16" (i.e., only 4 bits) are substantially used.

Figure 8:
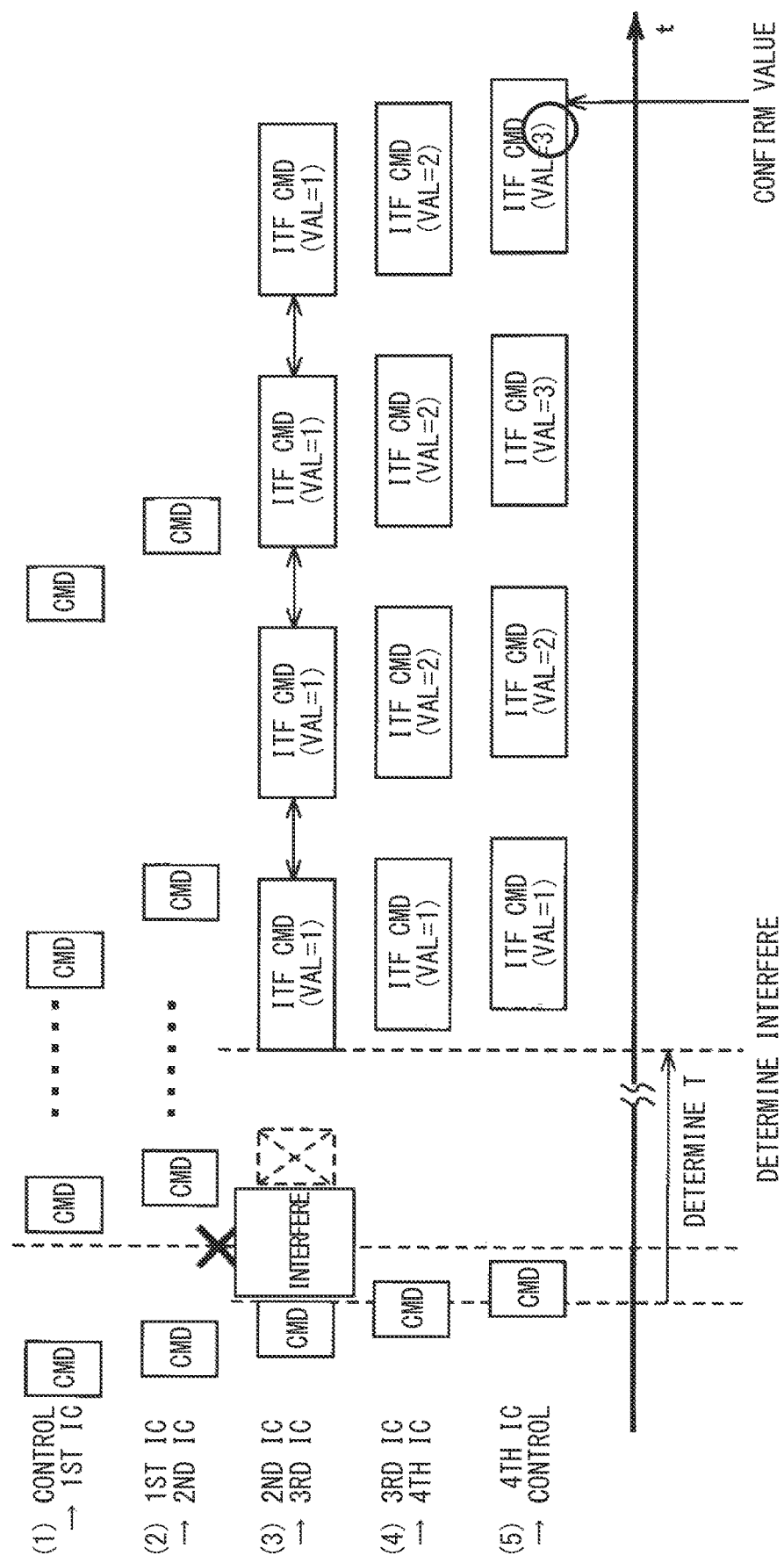
FIG. 8 is a timing chart showing a state in which a communication interruption command is transferred between a control IC and a monitoring IC when a communication interruption occurs, in a third embodiment.

Typically, when a CRC or the like is used for communication, the next communication processing is started after the calculation based on the CRC is performed to determine whether there is an error. On the other hand, in the third embodiment, as shown in FIG. 8, when the monitoring IC 2 receives the command, it transmits the command to the downstream side without checking the CRC.

Figure 9:
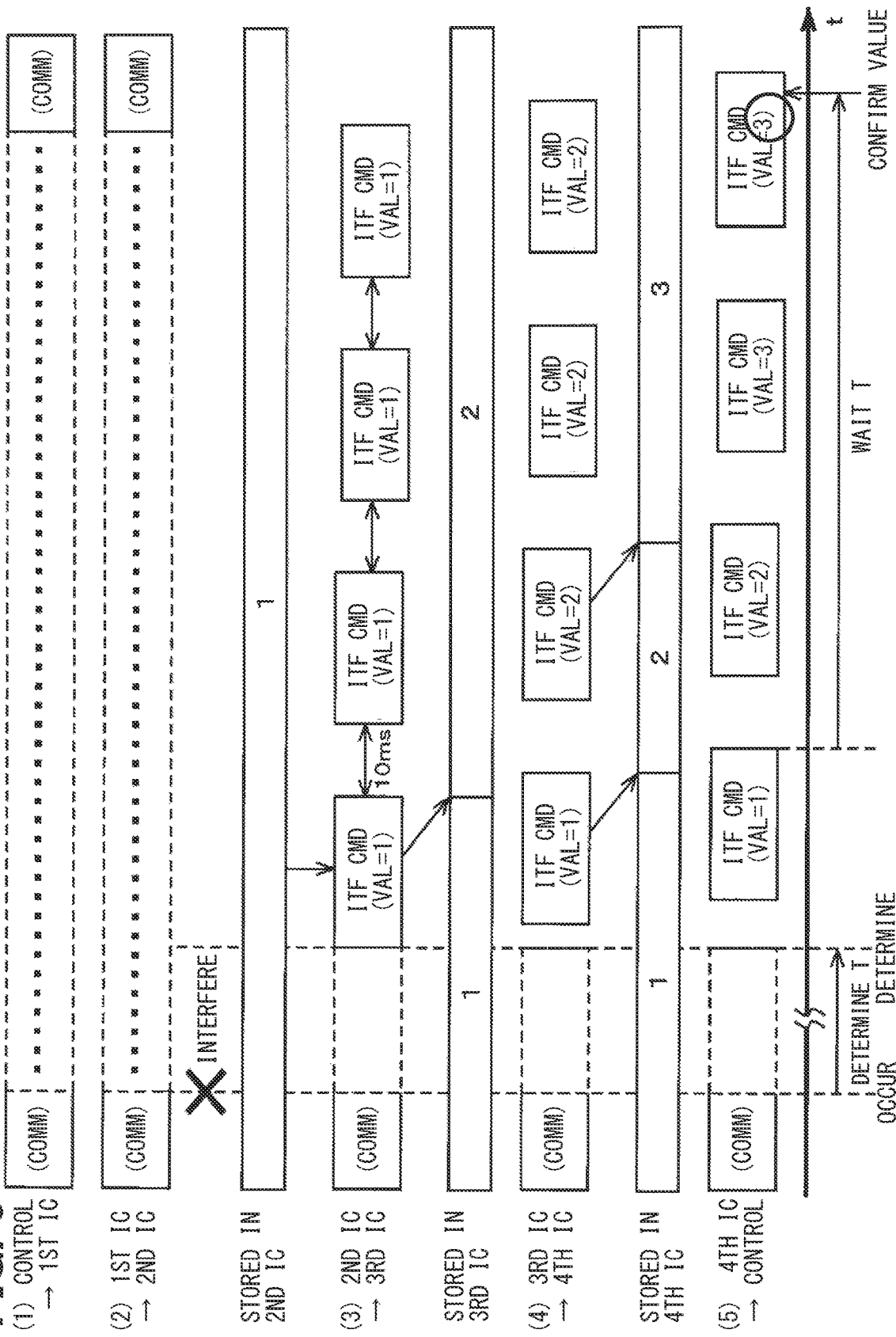
FIG. 9 is a timing chart showing details of processing performed by the monitoring IC.

Further, as shown in FIG. 9, when the communication interruption occurs as in the first embodiment, the monitoring IC 2(2) transmits a communication interruption command including the initial value "1". The count values held by the monitoring IC 2(3) and the monitoring IC 2(4) in associated with the communication interruption command are both initial values "1". Upon receiving the communication interruption command including a count value "1", the monitoring IC 2(3) transmits the communication interruption command including the count value "1" that is held at that time, to the downstream side. At the same time, the monitoring IC 2(3) increments the count value "1" that is included in the received command and holds the incremented count value "2" in an internal buffer or memory. The monitoring IC 2 (4) also performs the same processing. The count values held by the monitoring IC 2(3) and the monitoring IC 2(4) are both "2", and the control IC 1 receives the communication interruption command having the count value "1".

Then, when the interruption determination time elapses again, the monitoring IC 2(2) transmits the communication interruption command including the count value "1" again. Upon receiving the communication interruption command including the count value "1", the monitoring IC 2(3) transmits the communication interruption command of the count value "2" that is held at that time, to the downstream side. However, similarly to the previous time, the value "2" obtained by incrementing the count value "1" included in the received command is held in the internal buffer. Although the monitoring IC 2 (4) also performs the same processing, the count value held by the monitoring IC 2(4) becomes "3", and the control IC 1 receives the communication interruption command including the count value "2".

Then, when the interruption determination time elapses subsequently, the monitoring IC 2(2) transmits the communication interruption command including the count value "1", so that the processing performed by the monitoring IC 2(3) is the same as the previous time. When the monitoring IC 2 (4) receives the communication interruption command of the count value "2", it transmits the communication interruption command including the count value "3" held at that time, to the control IC 1. The control IC 1 thus receives the communication interruption command including the count value "3". The processing performed by the monitoring IC 2(4) after the next time will be the same as the previous time. Therefore, the count value in the communication interruption command received by the control IC 1 remains "3".

That is, suppose that the control IC 1 confirms the reception of the communication interruption command including the count value "3" after a sufficient determination waiting time has elapsed since the control IC 1 received the communication interruption command for the first time. In such case, the control IC 1 can identify that the communication interruption has occurred at a midpoint or in-between point between the monitoring IC 2(1) and the monitoring IC 2(2).

That is, according to the above configuration, the followings operate. That is, a command is transmitted with a check code to the plurality of monitoring circuits with each of cycles. The plurality of monitoring circuits are configured to store value data as stored value data respectively in memories corresponding to the monitoring circuits. In response to starting of receiving the command, each of the plurality of monitoring circuits is configured to transmit the command to the downstream side in the daisy chain connection before making a determination based on the check code. In response to determining that the command has not been received over the cycle, a first monitoring circuit that is one of the plurality of monitoring circuits is configured to transmit, to the downstream side, a first transmitted communication interruption command including an initial value, the initial value being stored as the stored value data that is being stored in the memory corresponding to the first monitoring circuit at a time when determining that the command has not been received. In response to receiving, for a first time, a first received communication interruption command including a first received value data, a second monitoring circuit that is one of the plurality of monitoring circuits on the downstream side of the first monitoring circuit is configured to (i) transmit, to the downstream side, a second transmitted communication interruption command including the initial value stored as the stored value data that is being stored in the memory corresponding to the second monitoring circuit at a time when receiving the first received communication interruption command for the first time, (ii) apply a calculation process on the first received value data included in the first received communication interruption command to obtain a first updated value, and (iii) store the first updated value as the stored value data in the memory corresponding to the second monitoring circuit. In response to receiving, for a second time after the first time, a second received communication interruption command including a second received value data, the second monitoring circuit is further configured to transmit, to the downstream side, a third transmitted communication interruption command including the first updated value stored as the stored value data that is being stored in the memory corresponding to the second monitoring circuit at a time when receiving the second received communication interruption command. In response to receiving a third received communication interruption command including a third received value data, the control circuit is configured to identify a location where a communication interruption occurs based on the third received value data included in the third received communication interruption command.

Further, in other words, a command is transmitted with a check code to the plurality of monitoring circuits on a downstream side in the daisy chain with each of cycles to provide an instruction. The plurality of monitoring circuits are configured to store value data as stored value data respectively in memories corresponding to the monitoring circuits. In response to a first monitoring circuit that is one of the plurality of monitoring circuits starting of receiving the command, the first monitoring circuit is configured to transmit the command to the downstream side before making a determination based on the check code. In response to the first monitoring circuit determining that the command has not been received over the cycle, the first monitoring circuit is configured to transmit, to the downstream side, a communication interruption command including an initial value as an included value data, the initial data being stored as the stored value data in the memory corresponding to the first monitoring circuit at a time when the first monitoring circuit determines that the command has not been received. In response to a second monitoring circuit that is one of the plurality of monitoring circuits receiving the communication interruption command for a first time, the second monitoring circuit is configured to (i) transmit, to the downstream side, the communication interruption command including, as the included value data, the initial value that is being stored as the stored value data in the memory corresponding to the second monitoring circuit at a time when the second monitoring circuit receives the communication interruption command for the first time, and (ii) apply a calculation process on the initial data as the included value data in the received communication interruption command for the first time to obtain a first updated value to store the first updated value as the stored value data in the memory corresponding to the second monitoring circuit. In response to the second monitoring circuit receiving the communication interruption command for a second time after the first time, the second monitoring circuit is configured to (i) transmit, to the downstream side, the communication interruption command including, as the included value data, the stored value data that is being stored in the memory corresponding to the second monitoring circuit at a time when the second monitoring circuit receives the communication interruption command for the second time, and (ii) apply the calculation process on the included value data that is included in the received communication interruption command for the second time to obtain a second updated value to store the second updated value as the stored value data in the memory corresponding to the second monitoring circuit.

In response to the control circuit receiving the communication interruption command, the control circuit is configured to identify a location where a communication interruption occurs based on the included value data in the received communication interruption command.

It is noted that in a state where the communication is normally performed, the command can be transmitted to the downstream side before the determination based on the CRC, so that the communication can be performed quickly.

Further, according to the third embodiment, the followings may operate. That is, the command transmitted by the control IC 1 includes the CRC. When the monitoring IC 2 starts receiving the command, the monitoring IC 2 transmits or transfers the command to the downstream side before making the determination based on the CRC. The monitoring IC 2 transmits the communication interruption command including an initial value (i.e., an initial count value, an initial count value data, or an initial value data) to the downstream side of itself by the same determination as in the first embodiment.

The monitoring IC 2, which receives the communication interruption command for the first time (i.e., at a first cycle), transmits the communication interruption command including the initial value to the downstream side of itself and holds the value data included in the received communication interruption command in the buffer. Then, when the communication interruption command is received in the next cycle (at a second cycle next to the first cycle), a calculation process is performed on the data or value data included in the communication interruption command held in the buffer, to provide an updated value data as the result of the calculation. The communication interruption command including the updated value is transmitted to the downstream side. When the control IC 1 receives the communication interruption command, the control IC 1 identifies the location where the communication interruption occurs, as in the first embodiment.

In other words, a command is transmitted with a check code to the plurality of monitoring circuits with each of cycles. In response to starting of receiving the command, each of the plurality of monitoring circuits is configured to transmit the command to the downstream side before making a determination based on the check code. In response to determining that the command has not been received over the cycle, a first monitoring circuit that is one of the plurality of monitoring circuits is configured to transmit a first transmitted communication interruption command including an initial value data to the downstream side. In response to receiving a first received communication interruption command including a first received value data for a first time, a second monitoring circuit that is one of the plurality of monitoring circuits on the downstream side of the first monitoring circuit is configured to transmit a second transmitted communication interruption command including the initial value data to the downstream side, and store the first received value data included in the first received communication interruption command in a buffer. In responding to receiving a second received communication interruption command including a second received value data for a second time after the first time, the second monitoring circuit is further configured to apply a calculation process on the first received value data that is being stored in the buffer at a time when receiving the second received communication interruption command, to obtain an updated value data, and transmit a third transmitted communication interruption command including the updated value data to the downstream side. In response to receiving a third received communication interruption command including a third received value data, the control circuit is configured to identify a location where a communication interruption occurs based on the third received value data included in the third received communication interruption command.

Further, in other words, a command is transmitted with a check code to the plurality of monitoring circuits on a downstream side in the daisy chain with each of cycles to provide an instruction. In response to a first monitoring circuit that is one of the plurality of monitoring circuits starting of receiving the command, the first monitoring circuit is configured to transmit the command to the downstream side before making a determination based on the check code. In response to the first monitoring circuit determining that the command has not been received over the cycle, the first monitoring circuit is configured to transmit a communication interruption command including an initial value as an included value data, to the downstream side. In response to a second monitoring circuit that is one of the plurality of monitoring circuits receiving the communication interruption command for a first time, the second monitoring circuit is configured to (i) transmit the communication interruption command including the initial value as the included value data, to the downstream side, and (ii) store, as a stored value data, the included value data in the received communication interruption command, in a buffer. In responding to the second monitoring circuit receiving the communication interruption command for a second time after the first time, the second monitoring circuit is further configured to (i) apply a calculation process on the stored value data that is being stored in the buffer at a time when receiving the communication interruption command for the second time, to obtain an updated value, and (ii) transmit the communication interruption command including the updated value as the included value data, to the downstream side. In response to the control circuit receiving the communication interruption command, the control circuit is configured to identify a location where a communication interruption occurs based on the included value data in the received communication interruption command.

Thus, in a state where the communication is normally performed, the command can be transmitted to the downstream side before the determination based on the CRC, so that the communication can be performed quickly.

Fourth Embodiment

As shown in FIG. 11, the fourth embodiment shows a case where it is applied to a daisy chain connection in which the forward path and the backward path are independent. When the first embodiment is applied to this configuration, the count value of the communication interruption command received by the control IC 1 becomes "6". Similarly to the first embodiment, it can be identified that the communication interruption has occurred between the monitoring IC 2(1) and the monitoring IC 2(2).

Other Embodiment

Each embodiment may be combined with another embodiment suitably to be implemented. The calculation process performed by the monitoring IC 2 is not limited to the addition of "1" or the multiplication of "2". Although the present disclosure has been described in accordance with the examples, it is understood that the present disclosure is not limited to such examples or structures. The present disclosure also includes various modifications and modifications within an equivalent range. In addition, various combinations and forms, and further, other combinations and forms including only one element, or more or less than these elements are also within the sprit and the scope of the present disclosure.

For reference to further explain features of the present disclosure, the description is added as follows.

There is an apparatus for monitoring an assembled battery; the apparatus has a configuration which connects a plurality of ICs connected to an assembled battery to detect a voltage with an ECU transmitting a command to the ICs in a daisy chain connection to perform communication. The daisy chain connection has a forward path and a backward path in communications. Such an apparatus detects whether the disconnection occurs in the forward path or the backward path.

However, the above configuration cannot identify a disconnected in-between point among a plurality of in-between points between a plurality of ICs in the forward path or backward path. It is thus desired to provide an assembled battery monitoring apparatus that can identify a location where a communication interruption occurs. Aspects of the present disclosure described herein are set forth in the following clauses.

According to a first aspect of the present disclosure, an assembled battery monitoring apparatus is provided to monitor an assembled battery configured by connecting a plurality of battery cells in multiple stages in series. The assembled battery monitoring apparatus includes (i) a plurality of monitoring circuits connected to the assembled battery and (ii) a control circuit connected with the plurality of monitoring circuits in a daisy chain connection to perform communication. The plurality of monitoring circuits are configured to monitor a state of the assembled battery. The control circuit is configured to transmit a command to the plurality of monitoring circuits at each of cycles to provide an instruction.

In response to determining that the command has not been received over the cycle, a first monitoring circuit that is one of the plurality of monitoring circuits is configured to transmit a first transmitted communication interruption command including an initial value data to a downstream side of the first monitoring circuit in the daisy chain connection. In response to receiving a first received communication interruption command including a first received value data, a second monitoring circuit that is one of the plurality of monitoring circuits on the downstream side of the first monitoring circuit is configured to (i) apply a calculation process on the first received value data included in the first received communication interruption command to obtain a first updated value data, and (ii) transmit a second transmitted communication interruption command including the first updated value data to a downstream side of the second monitoring circuit in the daisy chain connection. In response to receiving a second received communication interruption command including a second received value data, the control circuit is configured to identify a location where a communication interruption occurs based on the second received value data included in the second received communication interruption command.

That is, the monitoring circuit that has received the communication interruption command performs a certain calculation on the data or value data included in the communication interruption command. By using the updated value data that is obtained as the calculation result and included in the received communication interruption command, the control circuit can identify the location or the monitoring circuit where a communication interruption occurs.

According to a second aspect of the present disclosure, an assembled battery monitoring apparatus is provided to monitor an assembled battery configured by connecting a plurality of battery cells in multiple stages in series. The assembled battery monitoring apparatus includes (i) a plurality of monitoring circuits connected to the assembled battery, and (ii) a control circuit connected with the plurality of monitoring circuits in a daisy chain connection to perform communication. The plurality of monitoring circuits are configured to monitor a state of the assembled battery. The control circuit is configured to transmit a command with a check code to the plurality of monitoring circuits with each of cycles to provide an instruction.

In response to starting of receiving the command, each of the plurality of monitoring circuits is configured to transmit the command to a downstream side in the daisy chain connection before making a determination based on the check code. In response to determining that the command has not been received over the cycle, a first monitoring circuit that is one of the plurality of monitoring circuits is configured to transmit a first transmitted communication interruption command including an initial value data to a downstream side of the first monitoring circuit in the daisy chain connection. In response to receiving a first received communication interruption command including a first received value data at a first cycle, a second monitoring circuit that is one of the plurality of monitoring circuits on the downstream side of the first monitoring circuit is configured to (i) hold the first received value data included in the first received communication interruption command in a buffer, and (ii) transmit a second transmitted communication interruption command including the initial value data to a downstream side of the second monitoring circuit in the daisy chain connection. In responding to receiving a second received communication interruption command including a second received value data at a second cycle following the first cycle, the second monitoring circuit is further configured to (i) apply a calculation process on the first received value data that is being stored in the buffer at the second cycle to obtain an updated value data, and (ii) transmit a third transmitted communication interruption command including the updated value data to the downstream side of the second monitoring circuit. In response to receiving a third received communication interruption command including a third received value data, the control circuit is configured to identify a location where a communication interruption occurs based on the third received value data included in the third received communication interruption command.

Note that the assembled battery monitoring apparatus according to the second aspect has the same configuration as that of the first aspect except that: (i) the command transmitted by the control circuit contains a check code; (ii) when starting receiving the command, the monitoring circuit transmits the command to the downstream side before making the determination based on the check code; and (iii) upon receiving a communication interruption command at a first cycle, the monitoring circuit holds the command in the buffer; upon receiving a communication interruption command at a second cycle following the first cycle, the monitoring circuit performs calculation process on the value data included in the command held in the buffer. The above configuration according to the second aspect transmits the command to the downstream side before the determination based on the check code is made when communication is normally performed. The above configuration according to the second aspect can perform the communication quickly, in addition to the effects similar to those in the first aspect.

What is claimed is:

1. An assembled battery monitoring apparatus, comprising:
  a plurality of monitoring circuits connected to an assembled battery configured by connecting a plurality of battery cells in multiple stages in series, to monitor a state of the assembled battery; and
  a control circuit connected with the plurality of monitoring circuits in a daisy chain connection, to transmit a command with a check code to the plurality of monitoring circuits on a downstream side in the daisy chain connection with each of cycles to provide an instruction,
  wherein,
  in response to a first monitoring circuit that is one of the plurality of monitoring circuits and that starts to receive the command, the first monitoring circuit is configured to transmit the command to the downstream side before making a determination based on the check code; and
  in response to the first monitoring circuit indicating that the command has not been received over the cycle, the first monitoring circuit is configured to transmit a communication interruption command including an initial value as an included value data, to the downstream side,
  wherein,
  in response to a second monitoring circuit that is one of the plurality of monitoring circuits and that receives the communication interruption command for a first time, the second monitoring circuit is configured to
  transmit the communication interruption command including the initial value as the included value data, to the downstream side, and
  store, as a stored value data, the included value data in the received communication interruption command, in a buffer; and
  in response to the second monitoring circuit receiving the communication interruption command for a second time after the first time, the second monitoring circuit is further configured to
  apply a calculation process on the stored value data that is being stored in the buffer at a time when the second monitoring circuit receives the communication interruption command for the second time, to obtain an updated value, and transmit the communication interruption command including the updated value as the included value data, to the downstream side, and wherein, in response to the control circuit receiving the communication interruption command, the control circuit is configured to identify a location where a communication interruption occurs based on the included value data in the received communication interruption command.

2. An assembled battery monitoring apparatus, comprising:

a plurality of monitoring circuits connected to an assembled battery configured by connecting a plurality of battery cells in multiple stages in series, to monitor a state of the assembled battery; and a control circuit connected with the plurality of monitoring circuits in a daisy chain connection, to transmit a command with a check code to the plurality of monitoring circuits on a downstream side in the daisy chain with each of cycles to provide an instruction, wherein, the plurality of monitoring circuits are configured to store value data as stored value data respectively in memories corresponding to the monitoring circuits, wherein, in response to a first monitoring circuit that is one of the plurality of monitoring circuits and that starts to receive the command, the first monitoring circuit is configured to transmit the command to the downstream side before making a determination based on the check code; and in response to the first monitoring circuit indicating that the command has not been received over the cycle, the first monitoring circuit is configured to transmit, to the downstream side, a communication interruption command including an initial value as an included value data, the initial data being stored as the stored value data in the memory corresponding to the first monitoring circuit at a time of the first monitoring circuit indicating that the command has not been received, wherein, in response to a second monitoring circuit that is one of the plurality of monitoring circuits and that receives the communication interruption command, the second monitoring circuit is configured to transmit, to the downstream side, the communication interruption command including, as the included value data, the stored value data that is being stored in the memory corresponding to the second monitoring circuit at a time of the second monitoring circuit receiving the communication interruption command, and apply a calculation process on the included value data in the received communication interruption command to obtain an updated value to store the updated value as the stored value data in the memory corresponding to the second monitoring circuit, and wherein, in response to the control circuit receiving the communication interruption command, the control circuit is configured to identify a location where a communication interruption occurs based on the included value data in the received communication interruption command.

* * * * *